United States Patent
Yao (10) Patent No.: US 12,532,630 B2
(45) Date of Patent: Jan. 20, 2026

(54) DISPLAY PANEL COMPRISING A PASSIVATION LAYER HAVING A PIXEL OPENING DISPOSED THEREIN AND BEING FILLED WITH A COLOR RESIST

(71) Applicant: Wuhan China Star Optoelectronics Semiconductor Display Technology Co., Ltd., Hubei (CN)

(72) Inventor: Jiaxu Yao, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 669 days.

(21) Appl. No.: 17/623,333

(22) PCT Filed: Dec. 21, 2021

(86) PCT No.: PCT/CN2021/140133
§ 371 (c)(1),
(2) Date: Dec. 28, 2021

(87) PCT Pub. No.: WO2023/108725
PCT Pub. Date: Jun. 22, 2023

(65) Prior Publication Data
US 2024/0074275 A1    Feb. 29, 2024

(30) Foreign Application Priority Data
Dec. 15, 2021 (CN) .......................... 202111533265.4

(51) Int. Cl.
*H10K 59/38* (2023.01)
*H10K 59/80* (2023.01)
*H10K 102/00* (2023.01)

(52) U.S. Cl.
CPC ........... *H10K 59/38* (2023.02); *H10K 59/879* (2023.02); *H10K 2102/351* (2023.02)

(58) Field of Classification Search
CPC .. H10K 59/8792; H10K 59/122; H10K 59/40; H10K 59/38; H10K 50/865;
(Continued)

(56) References Cited

U.S. PATENT DOCUMENTS 9,478,590 B2 * 10/2016 Lee ...................... H10K 59/126
9,673,263 B2 *  6/2017 Ono ........................ G02B 5/201
(Continued)

FOREIGN PATENT DOCUMENTS

CN    104282715     1/2015
CN    108987435    12/2018
(Continued)

OTHER PUBLICATIONS

International Search Report and the Written Opinion Dated Sep. 14, 2022 China State Intellectual Property Administration Re. Application No. PCT/CN2021/140133 and its Translation into English. (22 Pages).
(Continued)

*Primary Examiner* — Sophia T Nguyen (57) ABSTRACT

A display panel includes an array substrate, a light-emitting layer, a passivation layer and a color filter layer. The passivation layer includes a pixel opening disposed in correspondence with at least a portion of the light-emitting pixel. The color filter layer includes a color resist corresponding to the light-emitting pixel, and a light-obstructing part provided with a light transmission opening corresponding to the light-emitting pixel. A refractive index of the color resist is greater than a refractive index of the passivation layer, thereby increasing a light output rate and a display effect of the display panel through a multilayer structure.

10 Claims, 6 Drawing Sheets

(58) Field of Classification Search
CPC .............. H10K 59/35; H10K 59/352; G02F 1/136209; G02F 1/133512; G02F 1/133514
See application file for complete search history.

(56) References Cited

U.S. PATENT DOCUMENTS

| | | | | |
|---|---|---|---|---|
| 9,696,835 B2* | 7/2017 | Her | | G06F 3/0412 |
| 10,168,844 B2* | 1/2019 | Kwon | | H10K 59/38 |
| 10,181,500 B2* | 1/2019 | Kim | | H10K 59/878 |
| 10,677,968 B2* | 6/2020 | Kim | | G02B 5/003 |
| 10,770,515 B2* | 9/2020 | Kim | | H10K 59/8792 |
| 10,847,586 B2* | 11/2020 | Lee | | H10K 50/865 |
| 10,868,280 B2* | 12/2020 | Lee | | H10K 50/856 |
| 11,195,883 B2* | 12/2021 | Xianyu | | H10K 59/38 |
| 11,217,631 B2* | 1/2022 | Lee | | H10K 59/121 |
| 11,258,049 B2* | 2/2022 | Kim | | H10K 59/38 |
| 11,271,054 B2* | 3/2022 | Lee | | H10K 59/122 |
| 11,289,684 B2* | 3/2022 | Cho | | H10K 59/126 |
| 11,456,341 B2* | 9/2022 | Li | | H10K 50/82 |
| 11,502,142 B2* | 11/2022 | Lee | | H10K 59/879 |
| 11,614,840 B2* | 3/2023 | Kwon | | H10K 59/8792 345/174 |
| 11,758,763 B2* | 9/2023 | Cao | | H10K 59/38 257/89 |
| 11,793,049 B2* | 10/2023 | Xu | | H10K 59/38 257/40 |
| 11,849,605 B2* | 12/2023 | Choi | | H10K 59/38 |
| 11,860,465 B2* | 1/2024 | Moon | | G02B 26/0875 |
| 11,910,687 B2* | 2/2024 | Lee | | H10K 59/8792 |
| 11,943,962 B2* | 3/2024 | Xiao | | H10K 59/38 |
| 12,029,094 B2* | 7/2024 | Choi | | H10K 50/844 |
| 12,029,098 B2* | 7/2024 | Gong | | H10K 59/8792 |
| 12,161,040 B2* | 12/2024 | Yao | | H10K 59/8792 |
| 12,200,964 B2* | 1/2025 | Ge | | H10K 59/38 |
| 12,229,361 B2* | 2/2025 | Lee | | G06F 3/0446 |
| 12,238,966 B2* | 2/2025 | Jang | | H10K 59/65 |
| 12,302,695 B2* | 5/2025 | Kim | | H10K 50/844 |
| 12,373,054 B2* | 7/2025 | Lee | | H10K 59/8722 |
| 12,396,347 B2* | 8/2025 | Lee | | H10K 50/844 |
| 2014/0168584 A1* | 6/2014 | Lee | | G02F 1/133512 349/106 |
| 2015/0049030 A1* | 2/2015 | Her | | G06F 3/0412 345/173 |
| 2015/0123085 A1* | 5/2015 | Kim | | H10K 50/86 257/40 |
| 2015/0349030 A1* | 12/2015 | Ono | | G02B 5/003 257/40 |
| 2015/0362795 A1* | 12/2015 | Chen | | G02F 1/133512 257/40 |
| 2016/0087245 A1* | 3/2016 | Park | | H10K 50/856 257/40 |
| 2016/0378224 A1* | 12/2016 | Kwon | | H10K 59/1315 345/174 |
| 2017/0141349 A1* | 5/2017 | Kwak | | H10K 71/00 |
| 2017/0271429 A1* | 9/2017 | Kim | | H10K 59/35 |
| 2017/0278899 A1* | 9/2017 | Yang | | H10K 59/8731 |
| 2018/0067358 A1* | 3/2018 | Li | | G02F 1/133512 |
| 2018/0095195 A1* | 4/2018 | Kim | | G02B 5/003 |
| 2018/0095567 A1* | 4/2018 | Lee | | G06F 3/0412 |
| 2018/0095570 A1* | 4/2018 | Hong | | H10K 59/40 |
| 2018/0181240 A1* | 6/2018 | Heo | | H10K 59/40 |
| 2018/0182814 A1* | 6/2018 | Kim | | H10K 59/38 |
| 2018/0240822 A1* | 8/2018 | Lee | | H10K 59/122 |
| 2019/0013495 A1* | 1/2019 | Kim | | H10K 59/8792 |
| 2019/0129541 A1* | 5/2019 | Kwon | | H10K 59/8792 |
| 2019/0165074 A1* | 5/2019 | Lee | | H10K 50/86 |
| 2019/0206945 A1* | 7/2019 | Lin | | H10K 59/8792 |
| 2019/0214440 A1* | 7/2019 | Lee | | G06F 3/0446 |
| 2019/0252470 A1* | 8/2019 | Lee | | H10K 59/352 |
| 2019/0341428 A1* | 11/2019 | Lee | | H10K 59/40 |
| 2019/0348470 A1* | 11/2019 | Song | | H10K 59/8792 |
| 2020/0066804 A1* | 2/2020 | Jung | | H10K 50/858 |
| 2020/0111856 A1* | 4/2020 | Lee | | G06F 3/0446 |
| 2020/0119113 A1* | 4/2020 | Lee | | H10K 50/11 |
| 2020/0152704 A1* | 5/2020 | Jang | | H10K 59/126 |
| 2020/0235186 A1* | 7/2020 | Jung | | H10K 59/122 |
| 2020/0243622 A1* | 7/2020 | Chung | | H10K 59/878 |
| 2020/0251528 A1* | 8/2020 | Lee | | H10K 59/40 |
| 2020/0395574 A1* | 12/2020 | Lee | | H10K 59/38 |
| 2020/0403039 A1* | 12/2020 | Park | | G06F 3/0446 |
| 2021/0005845 A1* | 1/2021 | Kim | | H10K 50/865 |
| 2021/0020698 A1* | 1/2021 | Xianyu | | H10K 59/38 |
| 2021/0028260 A1* | 1/2021 | Qi | | H10K 59/126 |
| 2021/0126056 A1* | 4/2021 | Kim | | H10K 71/00 |
| 2021/0175468 A1* | 6/2021 | Lee | | H10K 59/8731 |
| 2021/0200363 A1* | 7/2021 | Lee | | G06F 3/0445 |
| 2021/0226174 A1* | 7/2021 | Kim | | H04N 23/57 |
| 2021/0226175 A1* | 7/2021 | Cao | | H10K 59/38 |
| 2021/0263605 A1* | 8/2021 | Kim | | G06F 3/0443 |
| 2021/0273021 A1* | 9/2021 | Lee | | H10K 59/38 |
| 2021/0328107 A1* | 10/2021 | An | | H10K 59/131 |
| 2021/0328197 A1* | 10/2021 | Xu | | H10K 59/38 |
| 2021/0359012 A1* | 11/2021 | Im | | H10K 59/352 |
| 2021/0376007 A1* | 12/2021 | Choi | | H10K 71/00 |
| 2021/0397806 A1* | 12/2021 | Lu | | G06V 10/143 |
| 2021/0399262 A1* | 12/2021 | Woo | | H10K 59/40 |
| 2022/0006059 A1* | 1/2022 | Kim | | H10K 59/40 |
| 2022/0019003 A1* | 1/2022 | Ahn | | G02F 1/133514 |
| 2022/0052122 A1* | 2/2022 | Xianyu | | H10K 50/844 |
| 2022/0059805 A1* | 2/2022 | Cho | | H10K 59/40 |
| 2022/0069014 A1* | 3/2022 | Choi | | G06F 3/0446 |
| 2022/0123060 A1* | 4/2022 | Kang | | H10K 59/35 |
| 2022/0140010 A1* | 5/2022 | Lee | | H10K 59/121 345/173 |
| 2022/0140288 A1* | 5/2022 | Ji | | H10K 50/858 257/91 |
| 2022/0190045 A1* | 6/2022 | Lee | | G06F 3/04164 |
| 2022/0190300 A1* | 6/2022 | Jang | | H10K 59/122 |
| 2022/0199699 A1* | 6/2022 | Lee | | G06F 3/0412 |
| 2022/0199959 A1* | 6/2022 | Yu | | H10K 59/87 |
| 2022/0206607 A1* | 6/2022 | Lee | | G06F 3/0446 |
| 2022/0246881 A1* | 8/2022 | Lee | | H10K 59/40 |
| 2022/0262865 A1* | 8/2022 | Hou | | G06F 3/0446 |
| 2022/0285657 A1* | 9/2022 | Hong | | H10K 59/38 |
| 2022/0326794 A1* | 10/2022 | Kim | | G06F 3/04164 |
| 2022/0406867 A1* | 12/2022 | Choi | | H10K 77/00 |
| 2022/0415972 A1* | 12/2022 | Choi | | H10K 59/123 |
| 2022/0415979 A1* | 12/2022 | Choi | | H10K 59/8792 |
| 2022/0416001 A1* | 12/2022 | Kim | | H10K 59/131 |
| 2022/0416216 A1* | 12/2022 | Woo | | H10K 50/865 |
| 2023/0011669 A1* | 1/2023 | Lee | | H10K 59/8792 |
| 2023/0062159 A1* | 3/2023 | Cho | | H10K 59/38 |
| 2023/0069748 A1* | 3/2023 | Kim | | H10K 59/352 |
| 2023/0105374 A1* | 4/2023 | Jeong | | H10K 59/352 257/40 |
| 2023/0110227 A1* | 4/2023 | Baek | | H10K 71/00 257/91 |
| 2023/0111574 A1* | 4/2023 | Lee | | H10K 59/122 257/40 |
| 2023/0112427 A1* | 4/2023 | Yoo | | G06F 21/32 257/40 |
| 2023/0119532 A1* | 4/2023 | Jeon | | G06F 3/0446 257/40 |
| 2023/0165120 A1* | 5/2023 | Li | | H10K 59/60 257/91 |
| 2023/0200124 A1* | 6/2023 | Ryu | | H10K 50/854 257/40 |
| 2023/0320170 A1* | 10/2023 | Kim | | H10K 59/1201 257/40 |
| 2023/0354679 A1* | 11/2023 | Lee | | G09G 3/3233 |
| 2023/0363200 A1* | 11/2023 | Kim | | H10K 59/8792 |
| 2023/0363231 A1* | 11/2023 | Lee | | H10K 59/65 |
| 2023/0413651 A1* | 12/2023 | Jeon | | H10K 59/8792 |
| 2023/0422584 A1* | 12/2023 | Zhou | | H10K 59/8792 |
| 2024/0032377 A1* | 1/2024 | Zhu | | H10K 59/38 |
| 2024/0036672 A1* | 2/2024 | Shim | | G06F 3/0317 |
| 2024/0040899 A1* | 2/2024 | Yao | | H10K 59/8792 |
| 2024/0049516 A1* | 2/2024 | Lee | | H10K 59/122 |
| 2024/0074275 A1* | 2/2024 | Yao | | H10K 59/8792 |
| 2024/0121992 A1* | 4/2024 | Yoo | | G06F 3/0412 |
| 2024/0138229 A1* | 4/2024 | Choi | | H10K 59/60 |
| 2024/0147821 A1* | 5/2024 | Kwon | | H10K 59/122 |

(56) References Cited

U.S. PATENT DOCUMENTS

| | | | |
|---|---|---|---|
| 2024/0164146 A1* | 5/2024 | Im | H10K 59/873 |
| 2024/0215309 A1* | 6/2024 | Son | H10K 59/121 |
| 2024/0224764 A1* | 7/2024 | Choi | H10K 59/8792 |
| 2024/0224766 A1* | 7/2024 | Hwang | H10K 59/122 |
| 2024/0237475 A9* | 7/2024 | Choi | H10K 59/122 |
| 2024/0260432 A1* | 8/2024 | Shin | H10K 59/40 |
| 2024/0324416 A1* | 9/2024 | Kim | H10K 59/873 |
| 2025/0098473 A1* | 3/2025 | Kwon | H10K 59/38 |

FOREIGN PATENT DOCUMENTS

| | | |
|---|---|---|
| CN | 109216581 | 1/2019 |
| CN | 110323353 | 10/2019 |
| CN | 112670323 | 4/2021 |
| CN | 112750962 | 5/2021 |
| CN | 113113443 | 7/2021 |
| CN | 113113453 | 7/2021 |
| CN | 113241361 | 8/2021 |
| CN | 113410276 | 9/2021 |
| CN | 113644219 | 11/2021 |
| CN | 113054136 | 1/2022 |
| CN | 114267806 | 4/2022 |
| KR | 2018-0132386 | 12/2018 |

OTHER PUBLICATIONS

Notification of Office Action and Search Report Dated Jan. 28, 2023 From the State Intellectual Property Office of the People's Republic of China Re. Application No. 202111533265.4 and Its Translation of Office Action Into English. (19 Pages).

* cited by examiner

DISPLAY PANEL COMPRISING A PASSIVATION LAYER HAVING A PIXEL OPENING DISPOSED THEREIN AND BEING FILLED WITH A COLOR RESIST

RELATED APPLICATIONS

This application is a National Phase of PCT Patent Application No. PCT/CN2021/140133 having International filing date of Dec. 21, 2021, which claims the benefit of priority of Chinese Patent Application No. 202111533265.4 filed on Dec. 15, 2021. The contents of the above applications are all incorporated by reference as if fully set forth herein in their entirety.

FIELD AND BACKGROUND OF THE INVENTION

This disclosure relates to a technical field of manufacturing a display panel, and more particularly to a display panel.

With the technology development of the flexible display screen, people have higher requirements on the quality and performance of display panels.

Compared with a conventional liquid crystal display (LCD), an organic light-emitting diode (OLED) device has advantages, such as the light and handy weight, the wide viewing angle, the high light-emitting efficiency and the like, and is widely applied to various fields. At present, the OLED display products are developed toward the large-size, the high refresh rate and the high brightness, so the higher requirements on the light-emitting rate and light-emitting performance of the OLED device have been requested. In the prior art of manufacturing the OLED light-emitting device, a color filter (CF) is usually adopted to replace a POL-less technical solution of a conventional polarizer in order to increase the light output efficiency, wherein this technology decreases a thickness of a film layer of the display panel from 100 μm to several microns, decreases the light loss in the film layer, and increases the light output rate from the original 40% to 61% to achieve the objectives of increasing the light output rate and the display effect of the display panel. However, with the further requirements of the OLED devices on the light-emitting performance and display effect, the light output rate achieved by the manufacturing technology, such as POL-less, still cannot satisfy usage requirements, and the light output rate of the display panel needs to be further increased.

Therefore, it is necessary to propose solutions to the problems in the prior art.

SUMMARY OF THE INVENTION

In summary, an OLED light-emitting device manufactured in the prior art still has the problems of the low light-emitting efficiency of the light-emitting device, the unideal display effect and the like when displaying frames.

In order to solve the above-mentioned problems, an embodiment of this disclosure provides a display panel to effectively improve the problems of the low light output rate, the unideal light-emitting effect and the like present in an OLED light-emitting device manufactured according to the prior art.

To solve the above-mentioned technical problems, the embodiment of this disclosure provides the following technological methods.

A first aspect of an embodiment of this disclosure provides a display panel, including:

an array substrate;
a light-emitting layer, which is disposed on one side of the array substrate and includes multiple light-emitting pixels;
a passivation layer, which is disposed on one side of the light-emitting layer away from the array substrate and includes a pixel opening disposed in correspondence with at least a portion of the light-emitting pixel, wherein the passivation layer has a thickness ranging from 1 micron to 10 microns;
a color filter layer, which is disposed on one side of the passivation layer away from the array substrate, and includes: a color resist corresponding to the light-emitting pixel; and a light-obstructing part provided with a light transmission opening corresponding to the light-emitting pixel, wherein the light-obstructing part is disposed on the one side of the passivation layer away from the array substrate, and no coincidence is present between the color resists corresponding to adjacent ones of the light-emitting pixels;
wherein at least a portion of the color resist is filled into the pixel opening, and a refractive index of the color resist is greater than a refractive index of the passivation layer.

According to an embodiment of this disclosure, the light-emitting pixels include: a first light-emitting pixel displaying a first color, and a second light-emitting pixel displaying a second color different from the first color;
wherein the color resist includes: a first color resist transmitting the first color and a second color resist transmitting the second color; and the light-obstructing part includes: a first light transmission opening corresponding to the first light-emitting pixel, and a second light transmission opening corresponding to the second light-emitting pixel;
wherein the passivation layer includes a first pixel opening provided in correspondence with the first light-emitting pixel, and the passivation layer and the second light-emitting pixel are not disposed in an overlapped manner;
wherein the first color resist is filled into the first pixel opening, and the second color resist is filled into the second light transmission opening.

According to an embodiment of this disclosure, a height from a bottom surface of the first color resist to the array substrate is equal to a height from a bottom surface of the second color resist to the array substrate.

According to an embodiment of this disclosure, the light-obstructing part at an edge of the first light transmission opening covers a portion of the first color resist, and the second color resist is filled into the second light transmission opening and covers a portion of the light-obstructing part.

According to an embodiment of this disclosure, the black matrix layer is disposed on the organic layer, and a center line corresponding to the first pixel opening coincides with a center line corresponding to the first light transmission opening.

According to an embodiment of this disclosure, an aperture of the first light transmission opening is greater than an aperture of the first pixel opening.

According to an embodiment of this disclosure, the light-emitting pixels further include a third light-emitting pixel displaying a third color, wherein the first color, the second color, the third color are different from one another, and an area of the second light-emitting pixel and an area of the third light-emitting pixel are less than an area of the first light-emitting pixel, wherein the color resist further includes a third color resist transmitting the third color, and the light-obstructing part further includes a third light transmission opening corresponding to the third light-emitting pixel;

wherein the passivation layer and the third light-emitting pixel are not disposed in an overlapped manner, and the third color resist is filled into the third light transmission opening.

A second aspect of an embodiment of this disclosure provides a display panel, including:

an array substrate;

a light-emitting layer, which is disposed on one side of the array substrate and includes multiple light-emitting pixels;

a passivation layer, which is disposed on one side of the light-emitting layer away from the array substrate and includes a pixel opening disposed in correspondence with at least a portion of the light-emitting pixel;

a color filter layer, which is disposed on one side of the passivation layer away from the array substrate, and includes: a color resist corresponding to the light-emitting pixel; and a light-obstructing part provided with a light transmission opening corresponding to the light-emitting pixel, wherein the light-obstructing part is disposed on the one side of the passivation layer away from the array substrate;

wherein at least a portion of the color resist is filled into the pixel opening, and a refractive index of the color resist is greater than a refractive index of the passivation layer.

According to an embodiment of this disclosure, the light-emitting pixels include: a first light-emitting pixel displaying a first color, and a second light-emitting pixel displaying a second color different from the first color;

wherein the color resist includes: a first color resist transmitting the first color, and a second color resist transmitting the second color; and the light-obstructing part includes: a first light transmission opening corresponding to the first light-emitting pixel, and a second light transmission opening corresponding to the second light-emitting pixel;

wherein the passivation layer includes a first pixel opening provided in correspondence with the first light-emitting pixel, and the passivation layer and the second light-emitting pixel are not disposed in an overlapped manner;

wherein the first color resist is filled into the first pixel opening, and the second color resist is filled into the second light transmission opening.

According to an embodiment of this disclosure, a height from a bottom surface of the first color resist to the array substrate is equal to a height from a bottom surface of the second color resist to the array substrate.

According to an embodiment of this disclosure, the light-obstructing part at an edge of the first light transmission opening covers a portion of the first color resist, and the second color resist is filled into the second light transmission opening and covers a portion of the light-obstructing part.

According to an embodiment of this disclosure, the black matrix layer is disposed on the organic layer, and a center line corresponding to the first pixel opening coincides with a center line corresponding to the first light transmission opening.

According to an embodiment of this disclosure, an aperture of the first light transmission opening is greater than an aperture of the first pixel opening.

According to an embodiment of this disclosure, the light-emitting pixels further include a third light-emitting pixel displaying a third color, wherein the first color, the second color, the third color are different from one another, and an area of the second light-emitting pixel and an area of the third light-emitting pixel are less than an area of the first light-emitting pixel, wherein the color resist further includes a third color resist transmitting the third color, and the light-obstructing part further includes a third light transmission opening corresponding to the third light-emitting pixel;

wherein the passivation layer and the third light-emitting pixel are not disposed in an overlapped manner, and the third color resist is filled into the third light transmission opening.

According to an embodiment of this disclosure, a height from a bottom surface of the first color resist to the array substrate, a height from a bottom surface of the second color resist to the array substrate, and a height from a bottom surface of the third color resist to the array substrate are equal to one another.

According to an embodiment of this disclosure, the second color resist corresponding to the second light transmission opening and the third color resist corresponding to the third light transmission opening do not coincide with each other.

According to an embodiment of this disclosure, the display panel further includes: a touch layer, which is disposed between the light-emitting layer and the color filter layer, and includes a touch metal layer and the passivation layer, wherein the passivation layer disposed on one side of the touch layer near the color filter layer;

wherein the touch metal layer includes openings provided in correspondence with the first light-emitting pixel, the second light-emitting pixel and the third light-emitting pixel, the passivation layer covers the touch metal layer surrounding the first light-emitting pixel, and the light-obstructing part covers the touch metal layer surrounding the second light-emitting pixel and the third light-emitting pixel.

According to an embodiment of this disclosure, a cross-sectional shape of the pixel opening includes one or more of a trapezoid or an arc.

According to an embodiment of this disclosure, a side slope of the cross-sectional shape of the trapezoid corresponding to the pixel opening ranges from 30° to 45°.

According to an embodiment of this disclosure, a refractive index of the color resist ranges from 1.6 to 1.8, and a refractive index of the passivation layer ranges from 1.4 to 1.6.

Useful Effects

In summary, useful effects of the embodiment of this disclosure will be described in the following.

The embodiment of this disclosure provides a display panel including an array substrate, a light-emitting layer, a passivation layer and a color filter layer. The passivation layer includes a pixel opening disposed in correspondence with at least a portion of the light-emitting pixel. The color filter layer includes: a color resist corresponding to the light-emitting pixel; and a light-obstructing part provided with a light transmission opening corresponding to the light-emitting pixel. In the embodiment of this disclosure, at least a portion of the color resist is filled into the pixel opening, and the refractive index of the color resist is greater than the refractive index of the passivation layer. By filling the color resist into the pixel opening and configuring the refractive index of the color resist to be greater than the refractive index of the passivation layer, the above-mentioned multilayer structure can be provided to effectively increase the light output rate of the display panel, and finally implement the objective of enhancing the display effect of the display panel.

DESCRIPTION OF SPECIFIC EMBODIMENTS OF THE INVENTION

The descriptions of the following embodiments refer to the attached drawings for illustrating specific embodiments of this disclosure that can be implemented.

With the continuous development of the display panel manufacturing technology, people propose higher requirements on the performance and quality of the display panel. It is hoped that the manufactured display panel will have the better quality as well as the better comprehensive performance.

In order to further improve the performance of the display panel, the technical solution of replacing a conventional polarizer with a color filter is usually adopted to the manufacturing of a high-performance display panel in the existing technology. The above-mentioned technical solution can increase a light output rate of the display panel to a certain extent. However, the light output rate and a corresponding display effect of the display panel still cannot satisfy people's requirements.

An embodiment of this disclosure provides a display panel to effectively enhance the display effect and the comprehensive performance of the display panel.

Figure 1:
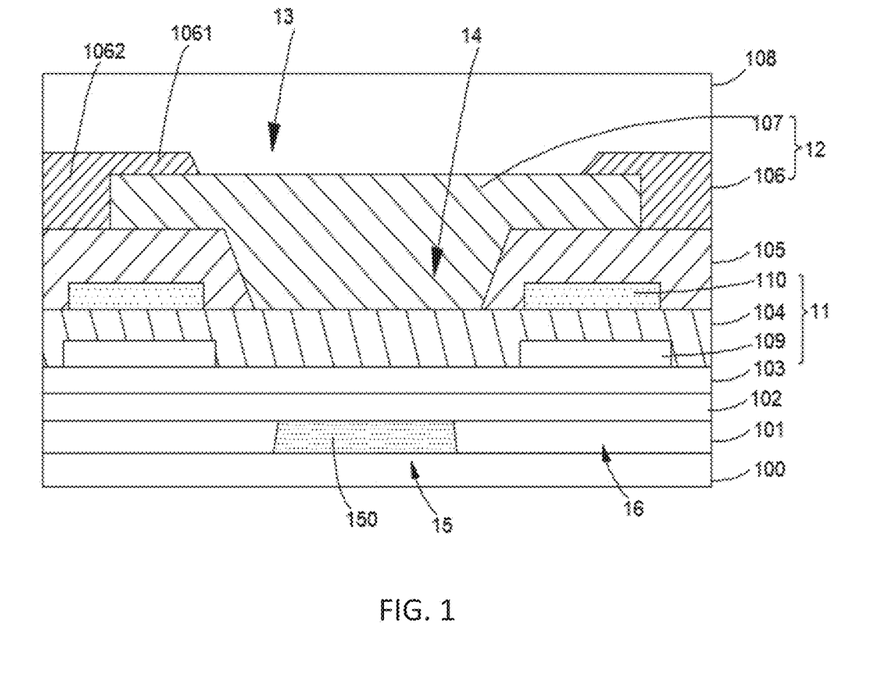
FIG. 1 is a schematic structure view showing film layers of a display panel provided by an embodiment of this disclosure.

FIG. 1 is a schematic structure view showing film layers of a display panel provided by an embodiment of this disclosure. Referring to FIG. 1, the display panel includes a substrate 100, a light-emitting layer 101, an encapsulation layer 102, a touch layer 11 and a color filter layer 12.

Specifically, the light-emitting layer 101 is disposed on the substrate 100, and the encapsulation layer 102 is disposed on the light-emitting layer 101. Meanwhile, the touch layer 11 is disposed on the encapsulation layer 102, and the color filter layer 12 is disposed on the touch layer 11. In the embodiment of this disclosure, the substrate 100 is an array substrate, the light-emitting layer 101 is driven by thin film transistors provided in the array substrate, so that the light-emitting layer 101 can emit light normally. When the light-emitting layer 101 is being provided, the light-emitting layer 101 may further include multiple light-emitting pixel regions 15, in which light-emitting pixels 150 are provided. In the embodiment of this disclosure, the light-emitting pixel regions 15 may be arranged in an array and disposed on the light-emitting layer 101, and the multiple light-emitting pixel regions 15 finally form light-emitting display regions in the display panel.

Further, in the embodiment of this disclosure, the encapsulation layer 102 is disposed on the light-emitting layer 101, and seals the light-emitting film layer of the display panel, thereby effectively preventing external water vapor and other substances from permeating the inside of the display panel through an interlayer gap of the light-emitting layer 101, and preventing the performance and the quality of the display panel from being affected. When the encapsulation layer 102 is being provided, the encapsulation layer 102 may be configured to a superimposed structure of multiple film layers, such as a structure composed of inorganic-organic-inorganic film layer sequentially superimposed, thereby effectively enhancing the package effect of the encapsulation layer 102.

Preferably, the touch layer 11 is further disposed on the encapsulation layer 102 to implement the touch operation of the display panel. In the embodiment of this disclosure, the touch layer 11 is disposed between the light-emitting layer 101 and the color filter layer 12. The film layer structure of the touch layer 11 is improved to achieve the effect of increasing the light output rate of the display panel.

Specifically, a passivation layer 105 may further be disposed on the touch layer 11, or the passivation layer 105 is directly disposed on other film layers of the touch layer 11 to form the touch layer 11 together with the other film layers. The two structures corresponding to the above-mentioned passivation layers are substantially the same. Therefore, the touch layer 11 including the passivation layer 105 is taken as an example to be explained in the embodiment of this disclosure. Specifically, the touch layer 11 includes a first inorganic insulating layer 103, a second inorganic insulating layer 104 and the passivation layer 105. The first inorganic insulating layer 103 is disposed on the encapsulation layer 102, and the second inorganic insulating layer 104 is disposed on the first inorganic insulating layer 103. Meanwhile, the passivation layer 105 is disposed on the second inorganic insulating layer 104.

In the embodiment of this disclosure, the touch layer 11 is further provided with a touch metal layer, such as a touch electrode layer. Specifically, the touch electrode layer is disposed in a non-light-emitting pixel region 16 of the display panel. For example, the touch electrode layer surrounds the light-emitting pixel corresponding to the light-emitting region, thereby preventing the touch electrode layer from obstructing the light outputted from the light-emitting layer 101. In the embodiment of this disclosure, the touch electrode layer may include a first touch electrode layer 109 and a second touch electrode layer 110. The first touch electrode layer 109 and the second touch electrode layer 110 may be disposed in different film layers. For example, the first touch electrode layer 109 is disposed on the first inorganic insulating layer 103, the second touch electrode layer 110 is disposed on the second inorganic insulating layer 104, the second inorganic insulating layer 104 covers the first touch electrode layer 109, and the passivation layer 105 covers the second touch electrode layer 110. In the embodiment of this disclosure, the touch electrode layer may be a mesh structure disposed on the corresponding film layer, thereby enhancing the touch effect of the touch layer in the display panel.

Further, in the embodiment of this disclosure, when the passivation layer 105 is being provided, an opening is formed on the passivation layer 105 to form a pixel opening 14 on the passivation layer 105. Specifically, the pixel opening 14 is manufactured and formed on the passivation layer 105 at a position corresponding to the light-emitting pixel region 15, and the pixel opening 14 is disposed between adjacent second touch electrode layers 110. After the light-emitting pixel region 15 in the light-emitting layer 101 has outputted light, the light further transmits into the pixel opening 14 corresponding to the light-emitting pixel region 15.

In the embodiment of this disclosure, the corresponding cross-sectional shape of the pixel opening 14 may be configured to have a trapezoid structure or an arced structure. Preferably, the pixel opening may further have other shapes of structures, and detailed descriptions thereof will be omitted herein. In the following embodiment, the trapezoid structure is taken as an example to be explained, and the trapezoid structure is configured to be an inverted trapezoid structure.

An aperture of the pixel opening 14 is not smaller than an aperture of the opening of the light-emitting pixel region 15 corresponding thereto, thereby guaranteeing the light emitted by the light-emitting pixel region 15 to be able to completely enter the pixel opening 14. Further, the pixel opening 14 provided in the embodiment of this disclosure can completely penetrate through the passivation layer 105 and expose the second inorganic insulating layer 104.

In the embodiment of this disclosure, when the trapezoidal cross-section corresponding to the pixel opening 14 is being configured, corresponding two sides of the trapezoidal cross-section are inclined in a manner away from a center of the pixel opening 14, so that a tilt angle is formed between a sidewall of the passivation layer 105 corresponding to the trapezoidal cross-section and a surface of the second inorganic insulating layer 104, wherein the tilt angle is the slope or inclined angle of the sidewall of the passivation layer 105. In the embodiment of this disclosure, the slope is configured to range from 30° to 45°, thereby guaranteeing the best output effect of light and effectively increasing the light output rate of the display panel.

Figure 2:
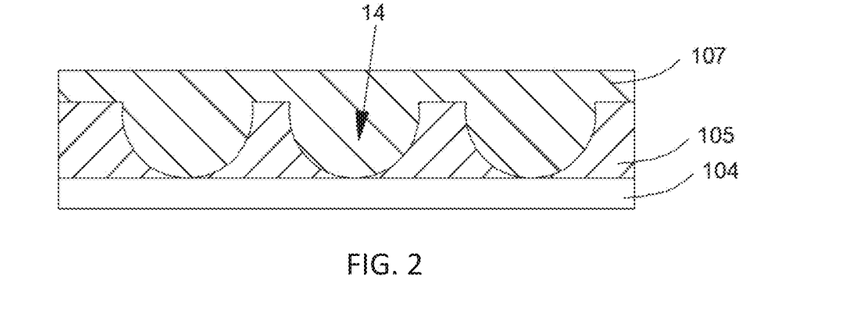
FIG. 2 is another schematic view corresponding to a pixel opening provided by the embodiment of this disclosure.

Further, please refer to FIG. 2. FIG. 2 is another schematic view corresponding to the pixel opening provided by the embodiment of this disclosure. In the embodiment of this disclosure, the cross-sectional shape of the pixel opening 14 may also be configured to be arced or semi-circular. The cross-sectional shape of the pixel opening 14 in FIG. 2 is configured to have the semi-circular structure. Because of the configuration of the semi-circular structure, a bottom of the semicircle can be in contact with the second inorganic insulating layer 104 or can be separated from the surface of the second inorganic insulating layer 104. When the bottom of the pixel opening 14 is separated from the second inorganic insulating layer 104, the pixel opening 14 is formed by only etching to a portion of the passivation layer 105. The structures of the above-mentioned pixel openings 14 can guarantee the optical effect. When the light of the light-emitting layer reaches the pixel opening 14, refraction occurs at the corresponding cross-section of the pixel opening 14 to effectively enhance the light input amount entering the pixel opening 14. Preferably, in order to decrease the thickness of each film layer in the embodiment of this disclosure, the thickness of the passivation layer 105 is configured to range from 1 micron to 10 microns.

Further, in the embodiment of this disclosure, the display panel further includes the color filter layer 12, which is disposed on one side of the passivation layer 105 away from the substrate 100 to replace the conventional polarizer structure. Specifically, the color filter layer 12 includes a light-obstructing part 106 and a color resist 107. The color resist 107 corresponds to the light-emitting pixel of the display panel, and the light-obstructing part 106 is disposed on one side of the passivation layer 105 away from the substrate 100. The light-obstructing part 106 encloses the light transmission openings 13 separately disposed on the touch layer 11, and each of the light transmission openings 13 is disposed in correspondence with the pixel opening 14 and the light-emitting pixel region 15, so that the display panel achieves the best light output effect.

In the embodiment of this disclosure, the color resist 107 is disposed in each light transmission opening 13, and at least a portion of the color resist 107 is filled into the corresponding pixel opening 14. When the light transmission opening 13 is disposed, it is guaranteed that a center line or a central axis corresponding to the pixel opening 14 coincides with a center line or a central axis corresponding to the light transmission opening 13. That is, when observation is made on a top view of the display panel, the center of the pixel opening 14 and the center of the corresponding light transmission opening 13 are located at the same center point, and the aperture corresponding to the light transmission opening 13 is greater than the aperture corresponding to the pixel opening 14.

Further, when the light-obstructing part 106 in the embodiment of this disclosure is being configured, the light-obstructing part 106 further covers the peripheral region of the color resist 107. That is, the light-obstructing part 106 covers the edge of the color resist 107, thereby guaranteeing the optical effect of the film layer in the region.

Specifically, the light-obstructing part 106 includes a cover part 1061 and a main body part 1062, wherein the cover part 1061 and the main body part 1062 of the light-obstructing part 106 are connected together, and the cover part 1061 is disposed near one side of the light transmission opening 13. In the light transmission opening 13, an accommodating space is formed between adjacent two light-obstructing parts 106, the cover part 1061 of the light-obstructing part 106 packs and covers the edge of the color resist 107, and the color resist 107 corresponding to the center region of the light transmission opening 13 is guaranteed to be completely exposed. In the embodiment of this disclosure, the cover part is disposed in the peripheral region of the color resist 107 to prevent the problem of the interference between adjacent two color resists, thereby effectively enhancing the display effect of the display panel.

In a sub-pixel region 14 in the embodiment of this disclosure, a distance from the side surface of the light-obstructing part 106 to the center of the sub-pixel region 14 is greater than a distance from the side surface of the passivation layer 105 to the center of the sub-pixel region 14. That is, there is a certain distance between the side surface of the light-obstructing part 106 and the inclined surface of the passivation layer 105. In this case, a platform is formed between the main body part 1062 of the light-obstructing part and the passivation layer 105 at the edge of the pixel opening, wherein the distance of the platform is set as ranging from 1 μm to 10 μm. In addition, the width of the cover part is set as ranging from 2 μm to 5 μm in the embodiment of this disclosure. Meanwhile, when the cover part 1061 is being configured, the width of the cover part 1061 is controlled, so that the peripheral region of the cover part 1061 does not overlap with the region formed by the pixel opening. That is, the edge of the cover part 1061 does not go beyond the edge of the platform.

Further, when the color resist 107 and the passivation layer 105 provided by the embodiment of this disclosure are being configured, a refractive index corresponding to the color resist 107 is different from a refractive index of the passivation layer 105. Specifically, the refractive index of the color resist 107 is greater than the refractive index of the passivation layer 105. Preferably, the refractive index of the color resist ranges from 1.6 to 1.8, and the refractive index of the passivation layer 105 in the touch layer ranges from 1.4 to 1.6, so that a micro array structure having different refractive indexes is formed in the region of the pixel opening 14. The micro array structure is used to effectively enhance the performance of the display panel.

Figure 3:
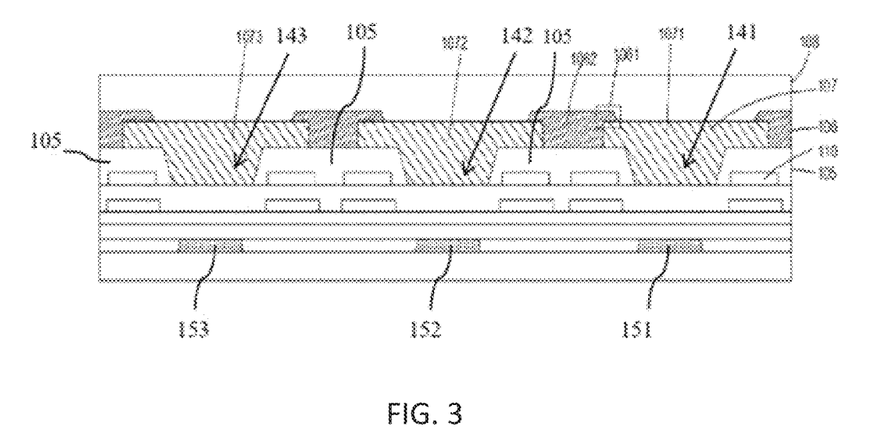
FIG. 3 is a schematic structure view showing another display panel provided by the embodiment of this disclosure.

Further, please refer to FIG. 3. FIG. 3 is a schematic structure view showing another display panel provided by the embodiment of this disclosure. Specifically, the display region of the display panel includes multiple light-emitting pixel regions. Specifically, each light-emitting pixel region includes a first light-emitting pixel 151 displaying the first color, a second light-emitting pixel 152 displaying the second color, and a third light-emitting pixel 153 displaying the third color. In the embodiment of this disclosure to be explained, the first color light-emitting pixel is a red light-emitting pixel, the second color light-emitting pixel is a blue light-emitting pixel, and the third color light-emitting pixel is a green light-emitting pixel. Specifically, the corresponding color resists are further provided in the pixel opening corresponding to the light-emitting pixels having different colors. In the embodiment of this disclosure to be explained, the color resist 107 in FIG. 3 includes the first color resist, the second color resist and the third color resist, for example. Specifically, the first color resist is a red color resist 1071, the second color resist is a blue color resist 1072 and the third color resist is a green color resist 1073. The red color resist 1071 is correspondingly disposed in a region of a first pixel opening 141, the blue color resist 1072 is correspondingly disposed in a region of a second pixel opening 142, while the green color resist 1073 is correspondingly disposed in a region of a third pixel opening 143.

Further, the light-obstructing part 106 includes a first light transmission opening 131 corresponding to the first light-emitting pixel 151, a second light transmission opening 132 corresponding to the second light-emitting pixel 152, and a third light transmission opening 133 corresponding to the third light-emitting pixel 153.

Combined with the schematic view of the film layers in FIG. 1, the bottom surfaces of the color resists disposed in the first pixel opening 141, the second pixel opening 142 and the third pixel opening 143 are located on the same plane in the embodiment of this disclosure. That is, the bottoms of the red color resist 1071, the blue color resist 1072 and the green color resist 1073 are located at the same height or level. When the pixel opening penetrates through the passivation layer 105, the bottom surfaces of the above-mentioned color resists having different colors are disposed on the surface of the passivation layer 105. Preferably, the above-mentioned light-obstructing part may be a black matrix layer.

Further, in the embodiment of this disclosure, a manufacturing method of the display panel is also provided. When the display panel in the embodiment of this disclosure is being manufactured and formed, the schematic structure views of the corresponding film layers are shown in FIGS. 4 to 8. FIGS. 4 to 8 are schematic structure views showing film layers corresponding to manufacturing processes of the display panel provided by the embodiment of this disclosure.

Figure 4:
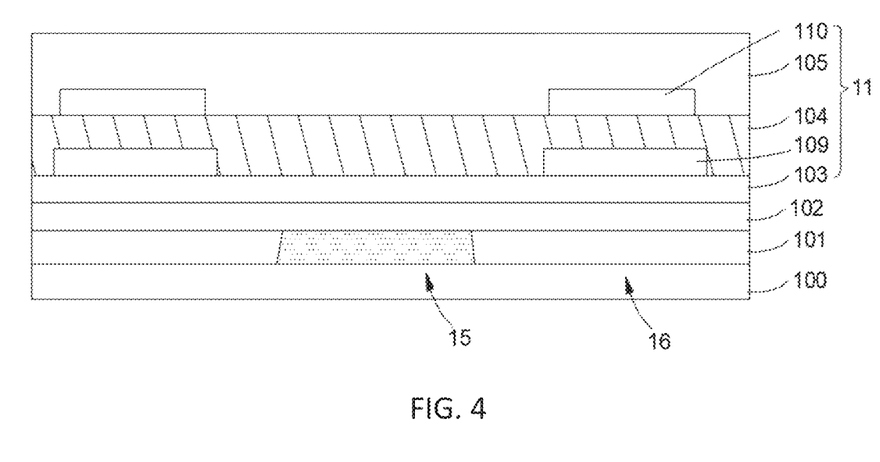
FIGS. 4, 5, 6, 7 and 8 are schematic structure views showing film layers corresponding to manufacturing processes of the display panel provided by the embodiment of this disclosure.

Referring to FIG. 4, the array substrate 100, the light-emitting layer 101 and the encapsulation layer 102 of the display panel are sequentially formed. The light-emitting layer 101 is disposed on the array substrate 100, and the encapsulation layer 102 is disposed on the light-emitting layer 101. Meanwhile, the light-emitting layer 101 includes the light-emitting pixel region 15.

The above-mentioned functional film layers can be manufactured according to the existing manufacturing processes, so detailed descriptions thereof will be omitted herein. After manufacturing is completed, the touch layer 11 is formed on the encapsulation layer 102. In the embodiment of this disclosure, the touch layer 11 includes multiple film layers. Specifically, the touch layer 11 includes the first inorganic insulating layer 103, the first touch electrode layer 109, the second inorganic insulating layer 104, the second touch electrode layer 110 and the passivation layer 105.

Specifically, the first inorganic insulating layer 103 is disposed on the encapsulation layer 102, the first touch electrode layer 109 is disposed on the first inorganic insulating layer 103, and the second inorganic insulating layer 104 is disposed on the first inorganic insulating layer 103 and covers the first touch electrode layer 109. Meanwhile, the passivation layer 105 is disposed on the second inorganic insulating layer 104 and covers a second touch electrode layer 109. When the touch electrode layer is being prepared, the touch electrode layer is formed in the non-light-emitting pixel region 16.

In the embodiment of this disclosure, when the passivation layer 105 is being manufactured, whole surface coating can be performed by way of spin coating, ink-jet printing or slit coating. Also, the refractive index of the passivation layer 105 ranges from 1.4 to 1.6, and the thickness of the film layer of the passivation layer 105 ranges from 1 micron to 10 microns. After the preparation is finished, the structure in FIG. 1 is formed.

Figure 5:
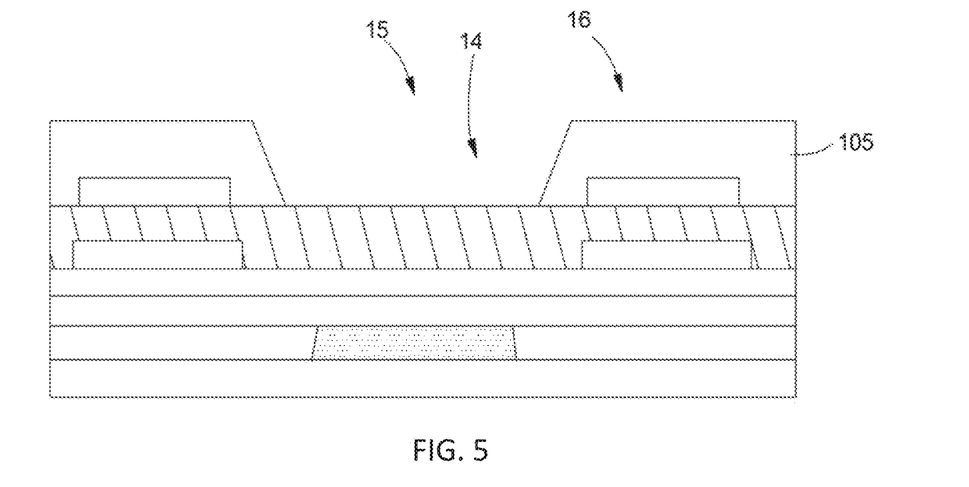

Referring to FIG. 5, after the above-mentioned film layers have been prepared, processing is performed on the film layer in FIG. 1. Specifically, the lithographing process is performed on the film layer corresponding to the light-emitting pixel region 15 through the exposure development manufacturing process. After the mask has been etched, the pixel opening 14 is formed on the passivation layer 105 corresponding to the light-emitting pixel region 15. The cross-section of the pixel opening 14 has a trapezoid structure, wherein two hypotenuses of the trapezoid form the sidewall of the pixel opening 14. Preferably, the shape, the dimension and the tilt angle of the sidewall of the pixel opening 14 may be designed according to actual products.

In the process of etching to form the pixel opening, it is guaranteed that the central axis of the pixel opening 14 coincides with the central axis corresponding to the light-emitting pixel region 15.

Figure 6:
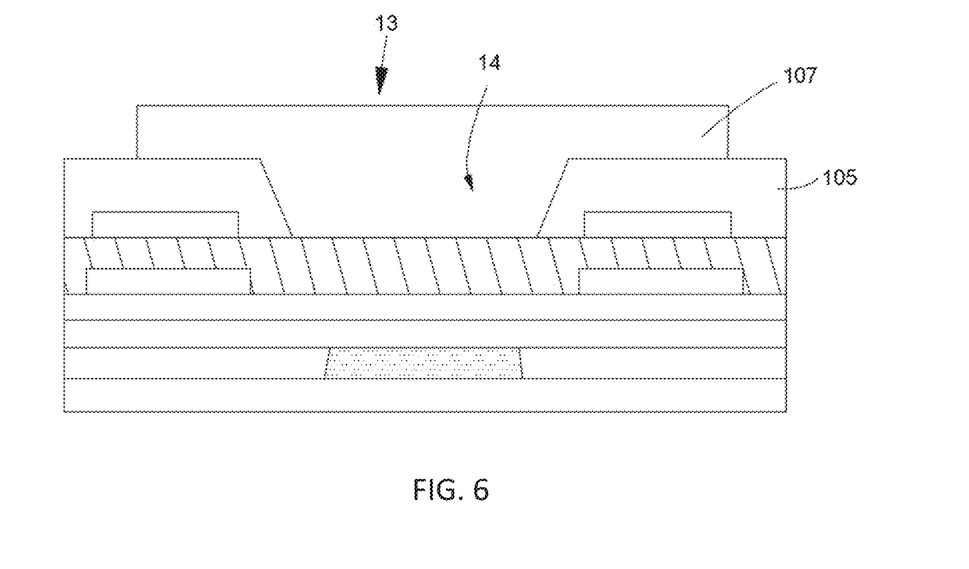
Figure 7:
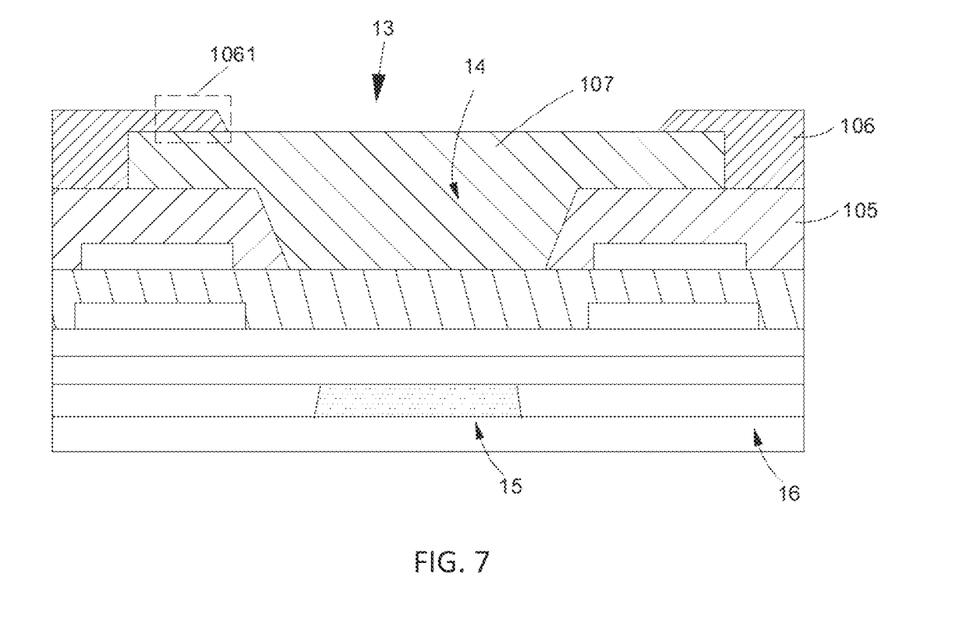

Referring to FIGS. 6 to 7, after etching is completed, the color resist 107 is formed on the touch layer. The color resist 107 is filled into the corresponding pixel opening 14 with the periphery of the color resist 107 extending outside the edge of the pixel opening 14. After the color resist 107 has been prepared, the color resist 107 forms the light transmission opening 13.

In the embodiment of this disclosure, after the color resist 107 has been prepared, the light-obstructing part 106 of the display panel is formed. When the light-obstructing part 106 is being formed, the light-obstructing part 106 is correspondingly disposed in the non-light-emitting pixel region 16 of the display panel, and the light-obstructing part 106 surrounds the corresponding color resist 107. The schematic view in the embodiment of this disclosure corresponds to the manufacturing process of one single light-emitting pixel.

When multiple light-emitting pixels are being manufactured, the manufacturing process thereof is the same as that of manufacturing the one single light-emitting pixel.

Further, when the light-obstructing part 106 is being manufactured, the light-obstructing part 106 further includes the cover part 1061 covering the peripheral edge of the color resist 107. On the same color resist 107, a light transmission opening 13 is formed between two parts of the cover part 1061 of the black matrix layer. The light outputted from the light-emitting layer can reach other film layers through the light transmission opening 13. In the embodiment of this disclosure, it is further guaranteed that the central axis corresponding to the light transmission opening 13 of the black matrix layer coincides with the central axis corresponding to the pixel opening 14, so that the light outputted from the pixel opening can completely travel out of the corresponding sub-pixel region.

Figure 8:
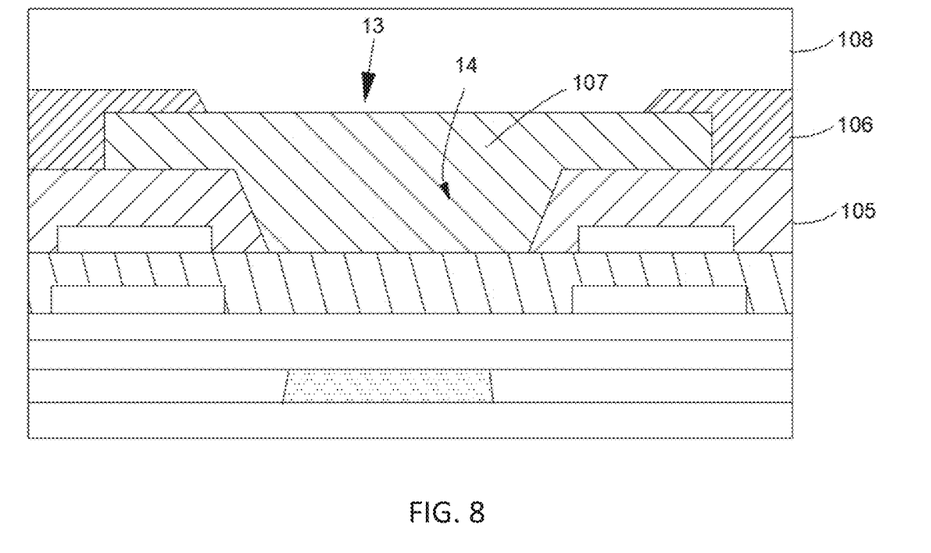

Referring to FIG. 8, after the light-obstructing part 106 and the color resist 107 in the embodiment of this disclosure have been prepared, the light-obstructing part 106 and the color resist 107 form the color filter layer in the embodiment of this disclosure, thereby replacing the conventional polarizer film layer to effectively enhance the performance of the display panel. Further, after the color filter layer has been prepared, a planarization layer 108 is formed on the color filter layer. The planarization layer 108 can be formed by way of spin coating, ink-jet printing or slit coating, and the thickness of the film layer of the planarization layer 108 ranges from 1 micron to 10 microns. After the planarization layer 108 has been prepared, the planarization layer 108 also has been planarized at the same time, and the film layer structure provided by the embodiment of this disclosure is finally formed.

Figure 9:
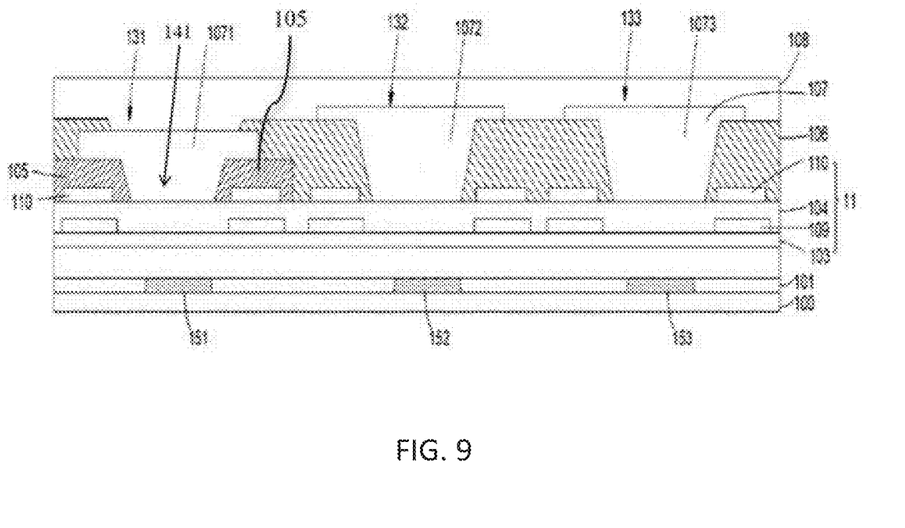
FIG. 9 is a schematic structure view showing film layers of another display panel provided by the embodiment of this disclosure.

Further, please refer to FIG. 9. FIG. 9 is a schematic structure view showing film layers of another display panel provided by the embodiment of this disclosure. Combined with the film layer structure of the display panel provided in FIG. 3, when the color resists having different colors are being prepared in this embodiment, the structures of the red color resist 1071, the blue color resist 1072 and the green color resist 1073 are not completely the same. However, it is guaranteed that the bottoms of the red color resist 1071, the blue color resist 1072 and the green color resist 1073 are located on the same plane.

Specifically, referring to FIG. 9, the passivation layer 105 is disposed in the region corresponding to the first light-emitting pixel 151, wherein the passivation layer 105 and the first light-emitting pixel 151 are disposed in an overlapped manner. In the regions corresponding to the second light-emitting pixel 152 and the third light-emitting pixel 153, the passivation layer 105 and the light-emitting pixels are not disposed in an overlapped manner. That is, the passivation layer 105 is not provided. At this time, the heights from the bottom surfaces of the first color resist 1071, the second color resist 1072 and the third color resist 1073 disposed in the corresponding pixel openings to the surface of the substrate 100 are the same.

Meanwhile, in the embodiment of this disclosure, the light-obstructing part 106 at the edge of the first light transmission opening 131 covers a portion of the first color resist 1071, and the color resists in the second light transmission opening 132 and the third light transmission opening 133 are filled into the corresponding openings and are disposed on the upper surface of the light-obstructing part 106 to cover a portion of the light-obstructing part 106.

Further, in the embodiment of this disclosure, the light-emitting surface area corresponding to the second light-emitting pixel 152 and the light-emitting surface area corresponding to the third light-emitting pixel 153 are less than the light-emitting surface area corresponding to the first light-emitting pixel 151, the second color resist corresponding to the second light transmission opening 132 does not coincide with the third color resist disposed in the third light transmission opening 133, and a gap is present therebetween.

Specifically, in the region of each light-emitting pixel, the second touch electrode layer 110 surrounds the pixel opening of the light-emitting pixel. Specifically, the second touch electrode layer 110 surrounds the first pixel opening 141 in the region of the first light-emitting pixel.

Meanwhile, in the region corresponding to the first light-emitting pixel 151, the passivation layer 105 covers the second touch electrode layer 110. In the region of the second light-emitting pixel and the region of the third light-emitting pixel, the light-obstructing part 106 covers the corresponding second touch electrode layer 110.

Further, when the green color resist 1073 is being provided, the passivation layer 105 is firstly formed on the touch layer 11 in the region corresponding to the third pixel opening 143, so that the passivation layer 105 covers the second touch electrode layer 110 in the corresponding region, and the passivation layer 105 is patterned to form the third pixel opening 143, wherein the passivation layer 105 is not disposed in the second pixel opening 142 and the first pixel opening 141.

After the passivation layer 105 has been prepared, the green color resist 1073 is disposed in the third pixel opening 143, so that the green color resist 1073 is filled into the third pixel opening 143 and covers at least a portion of the passivation layer 105.

After the green color resist 1073 has been prepared, the light-obstructing part 106 is formed. Specifically, in the region corresponding to the third pixel opening 143, the light-obstructing part 106 is disposed to surround the green color resist 1073, and the light-obstructing part 106 covers the peripheral region of the green color resist 1073 to finally form the structure shown in FIG. 9.

In the regions corresponding to the second pixel opening 142 and the first pixel opening 141, the light-obstructing part 106 is disposed on the touch layer. The light-obstructing part 106 covers the touch electrode in the corresponding region. In addition, the light-obstructing part 106 in different regions is etched to form the second pixel opening 142 and the first pixel opening 141. In the embodiment of this disclosure, when the first pixel opening 141, the second pixel opening 142 and the third pixel opening 143 are being formed, the bottoms of the pixel openings are disposed within the same plane height.

After the light-obstructing part 106 has been prepared, the blue color resist 1072 and the red color resist 1071 are disposed at the corresponding positions in the second pixel opening 142 and the first pixel opening 141. When the blue color resist 1072 and the red color resist 1071 are being provided, the color resist is fully filled into the corresponding pixel opening, and extends a certain distance beyond the region of the pixel opening, so that the color resist at least covers the black matrix layer at the edge of a portion of the pixel opening. Meanwhile, a certain distance is present between the blue color resist 1072 and the red color resist 1071. That is, the blue color resist 1072 and the red color resist 1071 do not contact each other, thereby effectively preventing the color mixing problem between the color resists having different colors.

Finally, the planarization layer 108 is formed on the color resist and the black matrix layer to form the structure of the display panel in the figure. In the embodiment of this disclosure, the material and manufacturing method of other film layers are the same as those of the above-mentioned embodiment, and detailed descriptions thereof will be omitted herein. The film layer structure corresponding to the green color resist in the pixel unit is improved, so that the film layer structure corresponding to the green color resist is different from the film layer structures corresponding to the blue color resist and the red color resist, that the light-emitting effect of the light-emitting pixel can be adjusted according to the actual product, and that the display panel can reach the best display effect. Preferably, the structure of the blue color resist or the green color resist may further be improved to achieve the objective of enhancing the light output rate and the display effect of the display panel.

Further, the embodiment of this disclosure further provides a display device including the display panel manufactured by the manufacturing method in the embodiment of this disclosure. The display device has the better light output efficiency and display effect.

Detailed introductions have been made to the display panel and the display device provided by the embodiments of this disclosure. In this disclosure, specific examples are used to explain the principles and implementation of this disclosure, the description of the above-mentioned embodiments is only used to help readers understand the technical solutions and core ideas of this disclosure. Those of ordinary skill in the art should understand that: they can still modify the technical solutions described in the foregoing embodiments, or equivalently replace some of the technical features; and these modifications or replacements do not cause the essence of the corresponding technical solutions to deviate from the scope of the technical solutions of the embodiments of this disclosure.

What is claimed is:

1. A display panel, comprising:
    an array substrate;
    a light-emitting layer disposed on one side of the array substrate and comprising multiple light-emitting pixels;
    wherein the light-emitting pixels comprise: a first light-emitting pixel displaying a first color, and a second light emitting pixel displaying a second color and a third light emitting pixel displaying a third color; the first color, the second color, the third color are different from one another;
    a passivation layer disposed on one side of the light-emitting layer away from the array substrate, wherein the passivation layer is disposed in a region corresponding to the first light-emitting pixel, the passivation layer and the first light-emitting pixel are disposed in an overlapped manner; the passivation layer is not provided in regions corresponding to the second light-emitting pixel and the third light-emitting pixel, and the passivation layer comprises a first pixel opening provided in correspondence with the first light-emitting pixel;
    a color filter layer disposed on one side of the passivation layer away from the array substrate, and comprising: a color resist and a light obstructing part, wherein the light-obstructing part is disposed on the one side of the passivation layer away from the array substrate;
    wherein a refractive index of the color resist is greater than a refractive index of the passivation layer;
    wherein the color resist comprises: a first color resist transmitting the first color, a second color resist transmitting the second color and a third color resist transmitting the third color;
    wherein the light obstructing part comprises: a first light transmission opening corresponding to the first light-emitting pixel, a second light transmission opening corresponding to the second light emitting pixel and a third light transmission opening corresponding to the third light emitting pixel;
    wherein the first color resist is filled into the first pixel opening, the first pixel opening corresponds to the first light transmission opening, the second color resist is filled into the second light transmission opening and the third color resist is filled into the third light transmission opening; the light-obstructing part covers one side of a portion of the first color resist away from the array substrate, the second color resist and the third color resist respectively cover one side of the light-obstructing part away from the array substrate;
    wherein a height from a bottom surface of the first color resist to the array substrate, a height from a bottom surface of the second color resist to the array substrate, and a height from a bottom surface of the third color resist to the array substrate are equal to one another.

2. The display panel according to claim 1, wherein the light obstructing part at an edge of the first light transmission opening covers a portion of the first color resist, and the second color resist is filled into the second light transmission opening and covers a portion of the light-obstructing part.

3. The display panel according to claim 1, wherein a center line corresponding to the first pixel opening coincides with a center line corresponding to the first light transmission opening.

4. The display panel according to claim 3, wherein an aperture of the first light transmission opening is greater than an aperture of the first pixel opening.

5. The display panel according to claim 1, wherein an area of the second light-emitting pixel and an area of the third light-emitting pixel are less than an area of the first light-emitting pixel.

6. The display panel according to claim 5, wherein the second color resist corresponding to the second light transmission opening and the third color resist corresponding to the third light transmission opening do not coincide with each other.

7. The display panel according to claim 5, further comprising:
    a touch layer, which is disposed between the light-emitting layer and the color filter layer, and comprises a touch metal layer and the passivation layer, wherein the passivation layer disposed on one side of the touch layer near the color filter layer;
    wherein the touch metal layer comprises openings provided in correspondence with the first light-emitting pixel, the second light-emitting pixel and the third light emitting pixel, the passivation layer covers the touch metal layer surrounding the first light-emitting pixel, and the light-obstructing part covers the touch metal layer surrounding the second light-emitting pixel and the third light-emitting pixel.

8. The display panel according to claim 1, wherein a cross-sectional shape of the first pixel opening comprises one or more of a trapezoid or an arc.

9. The display panel according to claim 8, wherein a side slope of the cross-sectional shape of the trapezoid corresponding to the first pixel opening ranges from 30° to 45°.

10. The display panel according to claim 8, wherein the refractive index of the color resist ranges from 1.6 to 1.8, and the refractive index of the passivation layer ranges from 1.4 to 1.6.

* * * * *